(12) United States Patent
Guruswamy et al.

(10) Patent No.: US 8,799,714 B1
(45) Date of Patent: Aug. 5, 2014

(54) GENERATING TEST SCENARIOS FROM APPLICATION-LAYER MESSAGES

(75) Inventors: Kowsik Guruswamy, Sunnyvale, CA (US); Yuri Khodosh, Sunnyvale, CA (US); Joshua Nisenson, Houston, TX (US)

(73) Assignee: Spirent Communications, Inc., Sunnyvale, CA (US)

( * ) Notice: Subject to any disclaimer, the term of this patent is extended or adjusted under 35 U.S.C. 154(b) by 324 days.

(21) Appl. No.: 13/413,353

(22) Filed: Mar. 6, 2012

(51) Int. Cl.
*G06F 11/263* (2006.01)
*G06F 11/36* (2006.01)
*G01R 31/3183* (2006.01)

(52) U.S. Cl.
CPC .......... *G06F 11/3684* (2013.01); *G06F 11/263* (2013.01); *G01R 31/3183* (2013.01)
USPC .............................. 714/32; 714/25

(58) Field of Classification Search
CPC .............. G06F 11/263; G06F 11/3684; G01R 31/3183
USPC .......................................................... 714/32
See application file for complete search history.

(56) References Cited

U.S. PATENT DOCUMENTS

| 8,301,720 | B1 * | 10/2012 | Thakker et al. | 709/217 |
| 2010/0268991 | A1 * | 10/2010 | Birch et al. | 714/32 |
| 2012/0173931 | A1 * | 7/2012 | Kube et al. | 714/37 |

FOREIGN PATENT DOCUMENTS

CN           103365661 A  *  7/2013  ............. G06F 11/36

* cited by examiner

*Primary Examiner* — Chae Ko
(74) *Attorney, Agent, or Firm* — Haynes Beffel & Wolfeld LLP; Ernest J. Beffel, Jr.

(57) ABSTRACT

Various example embodiments are directed to computer-implemented systems and methods for generating tests. A computer system may execute an application host and a browser. Messages originating from the application host and messages directed to the application host may be routed through the browser. The browser may be programmed to capture a plurality of application-level messages, which may comprise a plurality of requests originating from an application host and a plurality of responses directed to the application host. The computer system may generate a test scenario based on the plurality of application-level messages.

29 Claims, 8 Drawing Sheets

GENERATING TEST SCENARIOS FROM APPLICATION-LAYER MESSAGES

FIELD

This patent application generally relates to testing for computer hardware and/or software products, and systems and methods used to perform such testing. Some example embodiments relate to generating test scenarios based on application-layer messages. The application-layer messages may include message traffic between an application, such as a browser-executed application, and various hosts. In some example embodiments, the application-layer messages may be captured through the browser, for example, utilizing an extension or plug-in executed in conjunction with the browser.

BACKGROUND

Many computer hardware and/or software products (referred to herein as devices) are designed to operate despite challenging use conditions such as high interaction volumes, deliberate attacks, etc. Various testing methods are used to verify the ability of a device-under-test (DUT) to withstand different use conditions. Scale or volume testing methods model and apply high interaction volume conditions to the DUT. Such methods typically involve presenting high levels of concurrent users, high numbers of active connections, high incoming/outgoing bandwidth use, etc., and monitoring the resultant behavior of the DUT. Mutation testing methods generate and apply potential attacks on the DUT by generating mutated messages, presenting the mutated messages to the DUT, and monitoring responses from the DUT.

Some testing methods generate scale and mutation tests based on actual network traffic exchanged between devices. Often, these tests are generated based on packet captures, or pcaps, which include actual packets exchanged between devices in use. The captured packets are used to generate scale and/or mutation tests. The tests are then applied against one or more DUT's. Generating tests from packet captures, however, has certain limitations, especially in the context of complex applications, such as web applications for providing audio and/or video content. These applications transmit and receive large volumes of data, often in coordination with many hosts. Deriving high-level application state information from raw packet captures is computationally expensive. Existing packet capture-based testing methods either ignore high-level application state information (e.g., they are not stateful) or are limited to relatively simple applications. Further, many applications utilize encrypted communications. Generating tests based on encrypted packet captures is not possible without knowing the appropriate keys for decrypting each packet. Even with the proper keys, decrypting each packet adds to processing overhead.

DRAWINGS

DESCRIPTION

Figure 1:
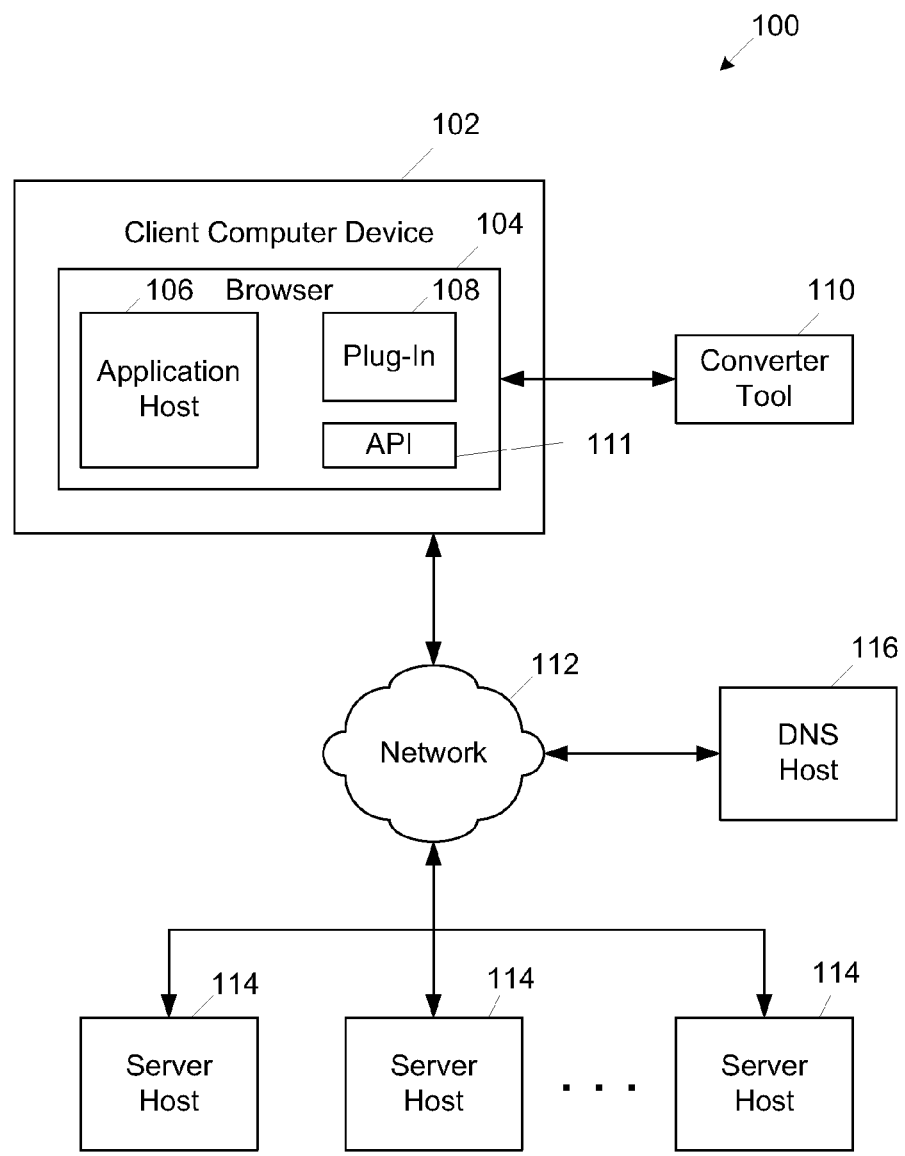
FIG. 1 is a block diagram showing one example embodiment of an environment in which an application-layer message transaction may take place.

The features and advantages described in the specification are not all inclusive and, in particular, many additional features and advantages will be apparent to one of ordinary skill in the art in view of the drawings, specification, and claims. The language used in the specification has been principally selected for readability and instructional purposes, and may not have been selected to delineate or circumscribe the disclosed subject matter.

The figures and the following description relate to example embodiments of the invention by way of illustration only. Alternative example embodiments of the structures and methods disclosed here may be employed without departing from the principles of what is claimed.

Various example embodiments are directed to systems and methods for generating test scenarios from application-layer messages. Utilizing application-layer messages for generating the test scenarios can provide certain advantages over the use of packet captures. For example, it is less computationally expensive to derive application state information from application-layer messages as opposed to packets or other network-layer messages. Also, many encryption protocols, such as SSL and TLS, are applied below the application-layer. As a result, messages captured at the application-layer may not require decryption.

The application-layer messages may be captured using any suitable method. In some example embodiments, application-layer messages are captured through a web browser. For example, an application (e.g., a web application) may be executed through a web browser. The web browser may be configured to capture application-layer messages to and from the application as the messages are routed through the web browser. For example, the application may communicate with one or more external hosts via an application program interface (API) of the web browser. The browser may capture incoming and outgoing messages at the API. In some example embodiments, the web browser executes a plug-in or extension to the web browser. The plug-in or extension may capture application-layer messages, for example, utilizing the API of the web browser. The captured application-layer messages may constitute one or more transactions, where a transaction is a set of related application-layer messages.

Captured messages may be processed and converted to one or more test scenarios, for example, by a converter tool executed by a computer system. Processing transaction messages may involve extracting various information from the messages as well as making various modifications to the messages. For example, the converter tool may determine hosts taking part in the transaction as well as the transports used for the transaction. In some example embodiments, the converter tool also associates corresponding request and response messages with one another. Additionally, in some example embodiments, the converter tool filters transaction messages to remove messages that do not affect the end result of the transaction. Such messages may include, for example, messages directed to or from other applications executing in the browser, messages relaying advertisements or other content not directly related to the operation of the application, etc. In some example embodiments, the converter tool also normalizes the content of the transaction messages. For example, content may be truncated to reduce the overall size of the test scenario. Certain types of content (e.g., binary content) may be truncated without affecting the states of the various hosts. Other types of content (e.g., textual content) may be important to application semantics and may not be truncated. Results of the message processing may be expressed as a processed message transaction. The processed message transaction may comprise the original messages, as modified during the processing. In various embodiments, the processed message transaction may additionally comprise extracted data describing the messages such as, for example, tables or other representations of detected hosts, tables or other representations of detected transports, etc.

From the processed message transaction, the converter tool may generate one or more test scenarios. Generally, a "scenario" or "test scenario" is a set of information that represents (models) one particular message exchange or transaction, which may be a single or multi-protocol exchange. A message may be, for example, a network packet, although a message may also include multiple packets. When captured at the application-layer, as described herein, a message may be a distinct message according to an application-layer protocol, such as HTTP. In one example embodiment, a scenario includes the following types of information: protocols, transports/services, hosts (message senders and receivers that participate in the scenario message exchange), message flows (incoming and outgoing), message structures and values, message order, field hierarchy within messages, instructions for recreating messages, assertions, and variables.

In various example embodiments, the converter tool embeds application state information in the test scenario. For example, the captured messages may utilize "cookies" to maintain application state information across discrete message exchanges. Such state information may be maintained in the test scenario, for example, as test scenario variables. Also, in some example embodiments, the converter tool supplements the test scenario to consider the action of a domain name system (DNS) server. For example, the converter tool may add a DNS sever as a host in the test scenario and may generate and/or otherwise incorporate into the scenario instructions for implementing messages from the application to the DNS sever. It will be appreciated that although message processing and scenario generation are described as distinct operations, in practice these operations may be performed together or, in some example embodiments, various actions may be swapped from one operation to the other.

Reference will now be made in detail to several embodiments, examples of which are illustrated in the accompanying figures. Wherever practicable similar or like reference numbers may be used in the figures and may indicate similar or like functionality. The figures depict example embodiments of the disclosed systems (or methods) for purposes of illustration only. One skilled in the art will readily recognize from the following description that alternative example embodiments of the structures and methods illustrated herein may be employed without departing from the principles described herein.

FIG. 1 is a block diagram showing one example embodiment of an environment 100 in which an application-layer message transaction may take place. The environment 100 comprises a client computer device 102, which executes a browser 104. The client computer device 102 may be any suitable type of computer device or system, for example, as set forth below. The browser 104 may be any suitable type of web or Internet browser such as, for example, a browser capable of hosting an application. In some example embodiments, the browser may be INTERNET EXPLORER, available from MICROSOFT CORPORATION, CHROME available from GOOGLE, INC., FIREFOX available from MOZILLA CORPORATION, etc. An application host 106 may execute on the client computer device 102 in the browser 104. The application host 106 may be an application for performing one or more tasks for a user of the client computer system 102. Such tasks may include, for example, providing multi-media content such as audio, video and/or textual content, executing a game, etc. In some example embodiments, the application host 106 is an application available from NETFLIX, YOUTUBE, or a similar multi-media content provider. Also, it will be appreciated that, in some embodiments, the browser 104 can execute other applications in addition to the application host 106. In some example embodiments, the browser 104 also provides an application program interface (API) 111 utilized by the browser 104 to communicate with various other hosts.

The application host 106 may be in electronic communication with various other hosts including, for example, a domain name service (DNS) host 116 and various server hosts 114. The DNS host 116 may implement a domain name service. For example, the application host 106 may query the DNS host 116 to receive the Internet addresses of various server hosts 114. The server hosts 114 may provide data content to the application host 106 including, for example, multimedia content such as audio and/or video content. In some embodiments, all or a portion of the application implementing the application host 106 may be executed remotely at one or more of the server hosts 114. The client computer device 102 and the various hosts 106, 116, 114 may be in communication with one another via a network 112. The network 112 may be and/or include any combination of wired and wireless network components. In some embodiments, the network 112 includes the Internet.

Referring back to the client computer device 102, the browser 104 may also include a plug-in or extension 108 configured to capture application-layer messages between the application host 106 and various other hosts 116, 114. The plug-in 108 may be any suitable plug-in for capturing application-layer messages. Examples of such plug-ins for the FIREFOX web browser include TAMPERDATA and FIREBUG. In some example embodiments, a plug-in may include an additional extension and/or add-on for capturing messages. For example, the FIREBUG plug-in my utilize an exention/add-on such as NETEXPORT. The plug-in 108 may be omitted in some embodiments, for example, if the browser 104 has native capacity for capturing application-layer messages. The captured message transaction may be provided to a converter tool 110. The converter tool 110 may be executed by the client computer device 102 or by another separate computer or system.

Figure 2:
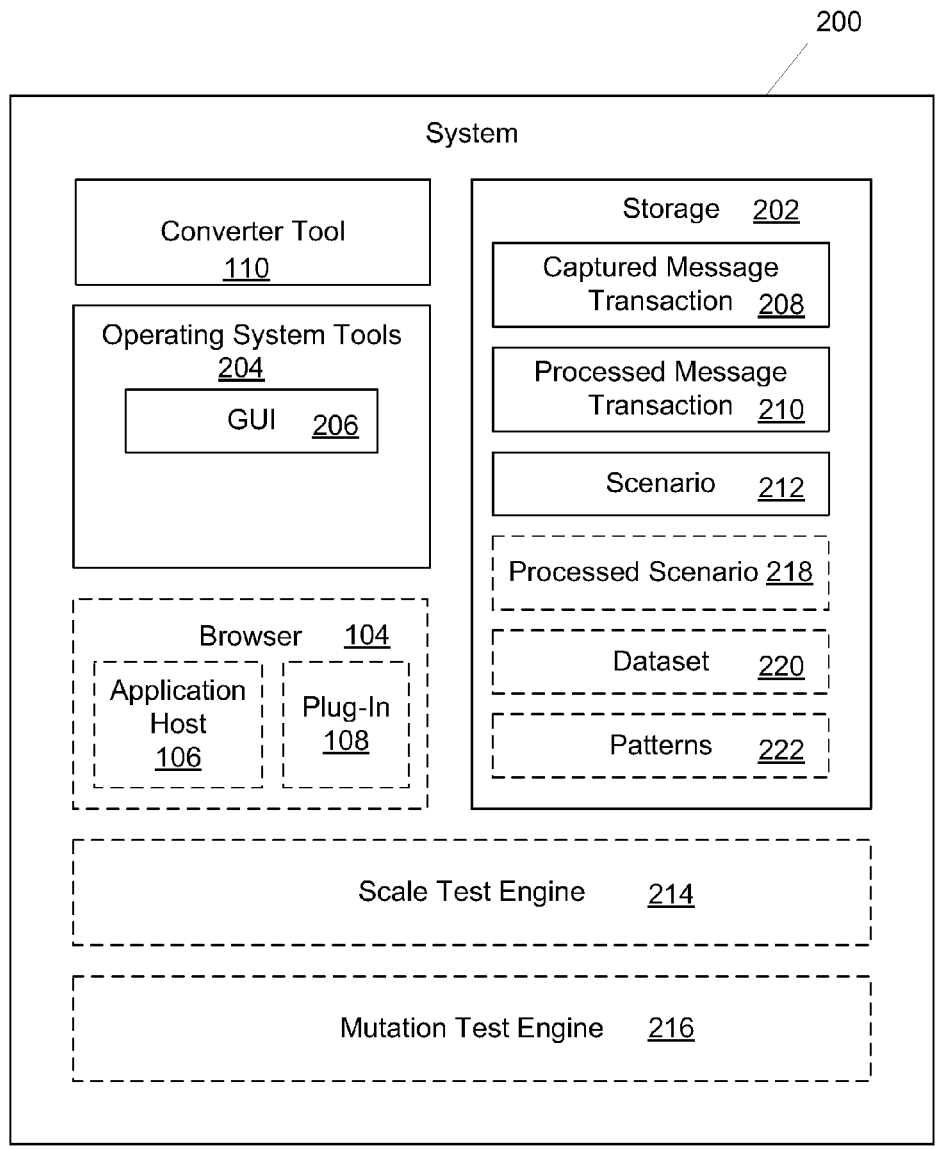
FIG. 2 is a block diagram showing one example embodiment of a computer system for executing the converter tool of FIG. 1.

FIG. 2 is a block diagram showing one example embodiment of a computer system 200 for executing the converter tool 110. The illustrated system 200 comprises the converter tool 110 as well as storage 202 and operating system tools 204. In one example embodiment, the converter tool 110 and operating system tools 204 are one or more computer program modules stored on one or more computer readable storage mediums and executing on one or more processors. The operating system tools 204 may include a graphical user interface (GUI) 206, although any suitable interface may be used. The GUI 206 outputs information to a user (e.g., using a display device) and receives information from a user (e.g., using a pointing device and/or keyboard). The storage 202 may include one or more computer readable storage mediums. Additionally, the converter tool 110, the operating system tools 204 and the storage 202 may be communicatively coupled to one another to at least the extent that data can be passed between them. In one example embodiment, the operating system tools 204 are executed as one or more parts of an operating system on a personal computer, and the converter tool 110 is executing on the same personal computer. The storage 202 may store one or more captured application-layer message transactions, such as 208, as well as various files related to the transaction 208 including, for example, one or more processed message transactions 210 and scenarios 212 generated from the message transaction.

Optionally, the computer system 200 may include various additional functionality. In some example embodiments, the computer system 200 executes the application host 106 and may also execute the browser 104 and plug-in 108, depending on whether these elements 104, 108 are present. Also, in some example embodiments, the computer system 200 is configured to generate and/or implement a scale and/or mutation test based on the scenario 212. For example, a scale test engine 214 may execute a scale test based on the scenario 212. In such example embodiments, the storage 202 may also comprise a data set 220 and one or more patterns 222 for executing a scale test. In example embodiments where the scale test engine 214 processes the scenario 212 prior to testing, a processed transaction 218 may be stored at storage 202. Also, optionally, a mutation test engine 216 may be present for executing one or more mutation tests based on the scenario 212. Additional details of scale tests and mutation tests based on the scenario 212 are provided herein. In various example embodiments, test engines, such as the scale test engine 214 and/or mutation test engine 216 may be implemented on separate computer systems.

Figure 3:
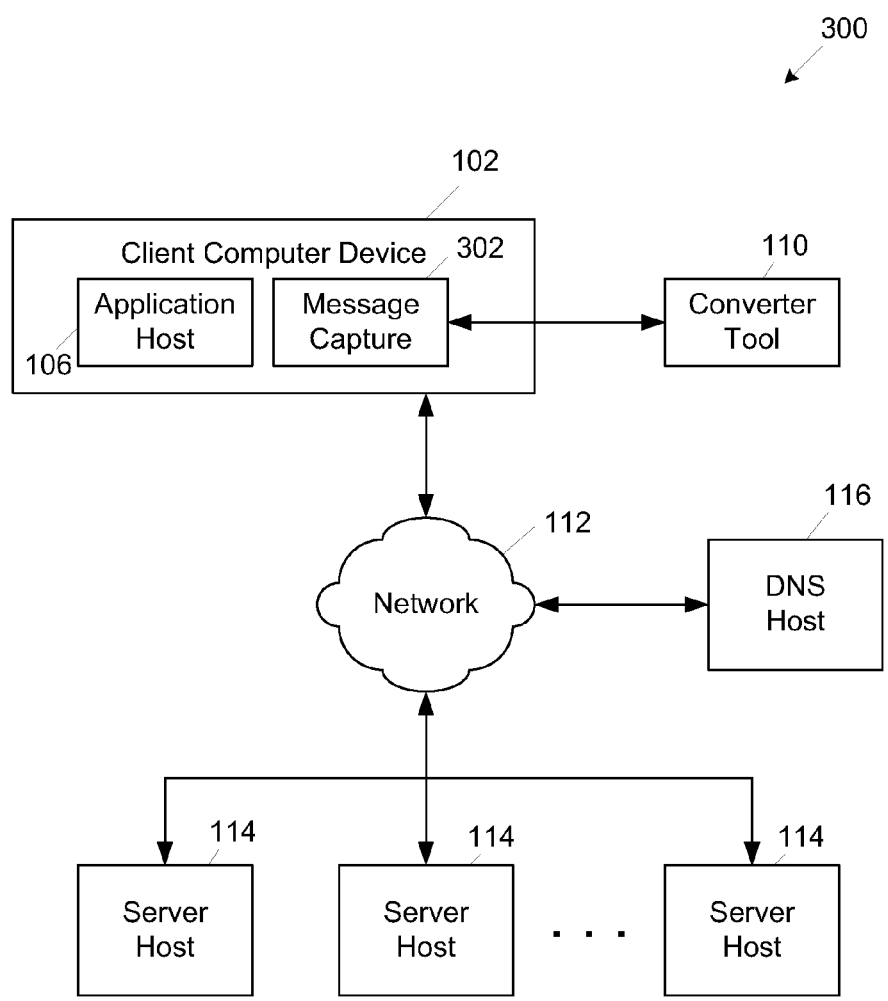
FIG. 3 is a block diagram of one example embodiment of an alternative environment in which an application-layer message transaction may take place.

FIG. 3 is a block diagram of one example embodiment of an alternative environment 300 in which an application-layer message transaction may take place. In the example environment 300, the application host 106 is executed by the client computer device 102 outside of the context of the browser 104. A message capture utility 302 may capture application-layer messages exchanged between the application host 106 and the various other hosts 114, 116. Captured message transactions may be provided to the converter tool 110 (e.g., implemented by a computer system such as 200) in the manner described above.

Figure 4:
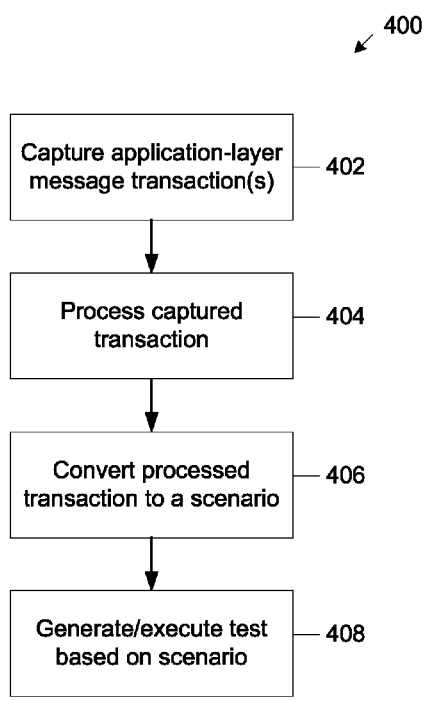
FIG. 4 is a flowchart illustrating one example embodiment of a process flow for generating and/or executing a test from application-layer messages.

FIG. 4 is a flowchart illustrating one example embodiment of a process flow 400 for generating and/or executing a test from application-layer messages. At 402, application-layer messages are captured. The application-layer messages may comprise one or more message transactions between the application host 106 and one or more additional hosts 114, 116. In example embodiments where the application host 106 is executed in a web browser, such as 104, the application-layer messages may be captured either by native functionality of the browser 104 or utilizing a plug-in 108, as described above. For example, application-layer messages between the application host 106 and various other hosts 114, 116 may be routed through the API 111 of the browser 104. The browser 104 and/or plug-in 108 may capture messages out-bound from the application host 106 (e.g., requests) as well as messages in-bound to the application host 106 (e.g., responses). For example, the browser 104 and/or plug-in 108 may capture messages at the API 111 of the browser 104.

Captured application-layer message transactions may be formatted according to any suitable application-layer protocol. In some example embodiments, the application-layer messages are formatted according to the HTTP protocol. The plug-in 108, browser 104, message capture utility 302 or other functionality may save the captured transactions in any suitable format. The saved content has enough structure to allow the original set of messages to be recreated (e.g., by the converter tool 110). Examples of suitable formats for saving captured HTTP messages include Extensible Markup Language (XML), JavaScript Object Notation (JSON), plain text, HTTP archive file (HAR), etc.

At 404, at least one captured transaction may be processed in preparation for the creation of a test scenario. The processing may be performed, for example, by the converter tool 110. Processing may involve deriving certain information from the messages, modifying certain aspects of some or all of the messages as well as, in some example embodiments, filtering non-relevant messages. In some example embodiments, the processing may include identifying transports and hosts used in a transaction. Individual messages may be mapped to the transport(s) and host(s) involved. Also, the converter tool 110 may identify and correlate corresponding request and response messages and, in some example embodiments, truncate or otherwise normalize message content. Optionally, the converter tool 110 may filter from a transaction messages that do not affect the outcome of the transaction. Results of the processing may be expressed as a processed message transaction 210 that may include the original messages, as modified, as well as various information extracted from the messages such as, for example, transports, hosts, etc. Additional details of message processing are provided below, for example, with respect to FIGS. 5-6.

At 406, the processed messages may be converted to one or more test scenarios, for example, by the converter tool 110. For example, the converter tool 110 may generate scenario objects for hosts and transports utilized in a transaction. Each message may be represented by a scenario instruction or instructions for re-creating the message during testing. In some example embodiments, the converter tool 110 may be programmed to generate additional objects to model interactions between the application host 106 and a DNS host 116. Also, in some example embodiments, the converter tool 110 may be configured to maintain an indication of the state of the application host 106 between messages and/or transactions by representing "cookies" included in the messages as scenario variables. Additional details of scenario generation are provided below, for example, with respect to FIG. 7.

At 408, the generated scenarios may be utilized to generate and/or execute a test directed to a device under test (DUT). The test or tests may be scale tests and/or mutation tests, which may be generated and/or executed by test engines such as, for example, the scale test engine 214 and/or the mutation test engine 216. Additional details of test generation and/or execution are also provided below.

Figure 5:
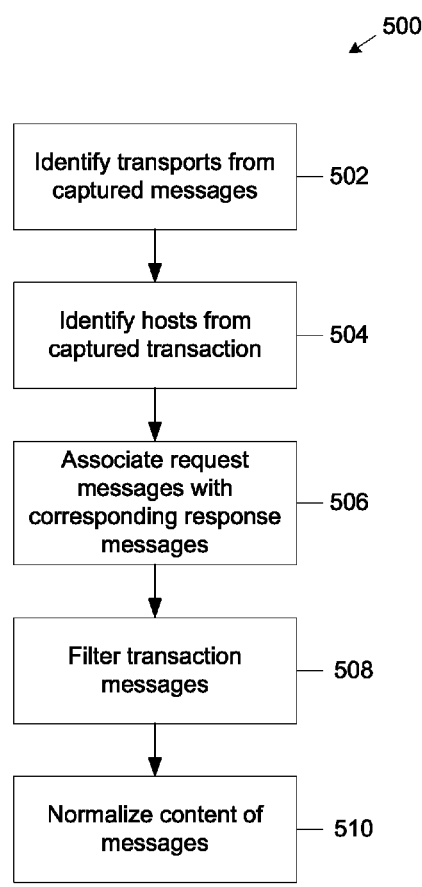
FIG. 5 is a flowchart illustrating one example embodiment of a process flow for processing captured application-layer messages.

FIG. 5 is a flowchart illustrating one example embodiment of a process flow 500 for processing captured application-layer messages. The process flow may be executed, for example, by the converter tool 110 or other suitable component. Although the process flow 500 provides the various actions 502, 504, 506, 508, 510 in an order, it will be appreciated that these actions may be performed in any suitable order. In various example embodiments, some of the actions 502, 504, 506, 508, 510 may be omitted. Also, in some example embodiments, various actions may be performed simultaneously. For example, identifying transports, described below at 502, and identifying hosts, described below at 504, may be performed at the same time. It will be further appreciated that, in some example embodiments, various actions of the process flow 500 may be performed during scenario generation as described below with respect to FIG. 7. The result of the processing of FIG. 5 may be a processed transaction 218, which may include the original messages, as modified, as well as additional information extracted from the messages such as, for example, hosts, transports, etc. The processed transaction 218 may be stored at storage 202.

At 502, the converter tool 110 may analyze captured application-layer messages to identify transports utilized by the messages. The transports may indicate transport-layer data describing the routing of the messages from origin to destination. Example transport-layer protocols for messages organized according to the HTTP application-layer protocol include Transmission Control Protocol (TCP), Secure Socket Layer (SSL) and Transport Layer Security (TLS). Each transport represents a connection between hosts. It will be appreciated that, in some cases, two hosts may be connected by more than one transport, depending on the nature of the messages being delivered and/or the state of the transaction. For example, a pair of hosts that need to transmit secure messages as well as unencrypted messages may be connected by an unencrypted transport (e.g., according to the TCP protocol) as well as a secure or encrypted transport (e.g., according to the SSL or TLS protocol).

Each transport may be characterized by various distinguishing information. For example, in some example embodiments, each transport may be characterized by a transport-layer protocol family, an application-layer protocol, a destination host, a destination port and an indicator of whether the transport is secure or encrypted. The transport-layer protocol family may indicate a transport-layer protocol family utilized by a message. In some example embodiments, the transport-layer protocol family is indicated as Internet Protocol v4 (IPv4) or Internet Protocol v6 (IPv6). Also, in some example embodiments, the transport-layer protocol family is specified as a parameter to the converter tool 110. For example, the transport-layer protocol used by the captured messages may be known in advance and provided to the converter tool 110. In some example embodiments, the converter tool 110 has functionality for detecting the protocol family from the captured messages. The application-layer protocol, as set forth above, is the protocol utilized to organize the application-layer message (e.g., HTTP). The destination host may indicate a host that is a recipient of the messages. Example destination hosts may include a DNS host 116 and/or a server host 114. The destination port may indication a software port at the destination host to which messages may be directed. The secure indicator may indicate whether the transport-layer protocol utilized is secure (e.g., encrypted). It will be appreciated that, as the messages are captured at the application-layer, they may be captured in unencrypted form regardless of whether a secure transport-layer protocol is used.

For some application-layer protocols such as HTTP, various transport information such as, for example, the application-layer protocol used, the destination host and port, and whether the transport is secure may be determined by examining a Universal Resource Locator (URL) associated with the message. In various example embodiments, the converter tool 110 extracts such information from the URL associated with a message. In some example embodiments, the converter tool 110 maintains a table of identified transports (e.g., as part of the processed message transaction 210). When a transport is encountered in the URL of a message, the converter tool 110 may consult the table to determine whether the encountered transport is new, or has been previously encountered. If the transport is new, it may be added to the table.

In some example embodiments, the converter tool 110 may generate an additional transport to represent communication between the application host 106 and a Domain Name Service (DNS) host 116. For example, URL's included in request messages generated by the application host 106 may be provided to a DNS host 116, which may return the symbolic (e.g., numeric) network address of the destination host identified by the URL. The captured transaction may not include actual messages exchanged between the application host 106 and the DNS host 116. For example, the application host 106 may have resolved the network addresses of relevant hosts prior to the captured transaction.

At 504, the converter tool 110 may identify hosts from the captured transaction. The identified hosts may also be stored at a table of hosts, which can be a part of the processed message scenario 210. The application host 106 may be considered a first host. In some example embodiments, the DNS host 116 is represented as a second identified host. For example, the converter tool 110 may be configured to emit DNS queries to resolve the names of other hosts participating in the transaction. Additional hosts may be determined by examining the URL's of the messages in the transaction. Upon encountering a new host referenced in a message URL, the converter tool 110 may emit a DNS query to identify the name of the encountered host. Upon determining the host name, the converter tool 110 may perform a map look-up at the table of hosts to determine if the encountered host is in the table. If the encountered host is not included in the table, the converter 100 may add it. Each transaction host may be identified using any suitable descriptors. In some example embodiments, some or all of the hosts may be identified by a name and a protocol family (e.g., IPv4, IPv6, etc.). At 506, the converter tool may associate request messages with corresponding response messages. Request messages are originated by the application host 106 and directed towards one of the other hosts 114, 116. Response messages are directed to the application host 106 by one of the hosts 114, 116 in response to a request message.

Figure 6:
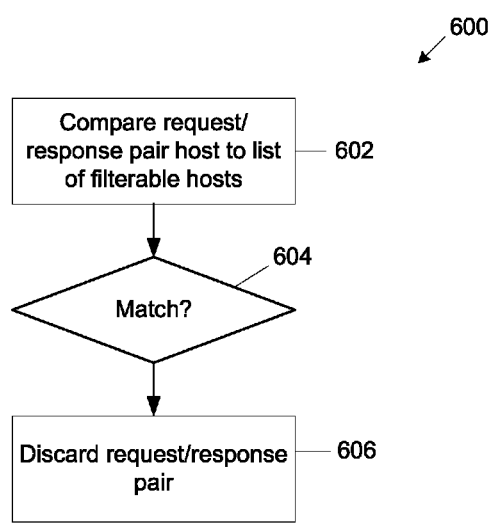
FIG. 6 is a flowchart illustrating one example embodiment of a process flow for filtering messages from a captured message transaction.

Optionally, the converter tool 110 may filter request/response message pairs in the transaction at 508 to remove messages that do not affect the end result of the transaction. Filtered (e.g., removed) messages may include messages that are "white noise." Such messages are typically messages injected to fetch advertisements and/or track users across sites for a particular advertiser. FIG. 6 is a flowchart illustrating one example embodiment of a process flow 600 for filtering messages from a captured message transaction. For example, the process flow 600 may implement the filter referenced above with respect to 508. Filtering may remove messages that are not relevant to the outcome of the transaction including messages that do not affect the state of the transaction host 106 or any other environment hosts. Examples of messages that may be filtered from the transaction include messages implementing advertisements, messages related to user activity tracking, messages related to pixel tracking, messages related to fetching static web page assets, such as style sheets, JavaScript or other code, etc. Filtering messages from a transaction, as described herein, may reduce the size of the ultimately-generated test and may allow testers to focus on important aspects of the application host 106, while ignoring trivial or irrelevant factors.

At 602, the converter tool 110 may compare captured messages and/or message request/response pairs to a list of filterable hosts or domains. The host and/or domain of the captured messages may be determined from the message's URL's. The filterable hosts or domains may be hosts and/or domains that are known to be associated with activities unrelated to the result of the transaction. If there is a match between the host and/or domain of a message and the list of filterable hosts and/or domains at 604, then the message may be removed from the transaction at 606. In some example embodiments, message request/response pairs are removed. If there is no match between the host and/or domain of a message and the list of filterable hosts and/or domains at 604, then the considered message and/or message request/response pair may not be removed. It will be appreciated, though, that additional filtering techniques may be applied that may, subsequently, filter the considered message and/or message request/response pair. For example, in some example embodiments, messages are filtered based on content instead of or in addition to domain/host. Examples of content types that may be removed include, for example, messages related to pixel tracking and messages having data describing a static web page asset, as described above.

Referring back to FIG. 5, the converter tool 110 may normalize the content of transaction messages at 510. Normalization may comprise various actions including, for example, saving and processing of message headers as well as processing and truncating of message body data. Regarding headers, messages according to HTTP and other application-layer protocols can have multiple headers and/or header fields, with each describing different aspects of the message. Processing the headers may comprise saving the headers for each messages. The captured headers may be incorporated into the test scenario, as described herein, and later used to construct valid messages during test execution.

In some example embodiments, saving certain headers may involve performing additional processing, depending on the header's role in how the message is represented and handled. For example, a content-length header specifies the size of the message content (e.g., the size of the HTTP message body). In some example embodiments, messages may be truncated either during processing and/or during test scenario execution. This may serve to keep the size of the scenarios management. Because the message content may be modified during scenario and/or test generation, the value of the content-length header may also change. Accordingly, the converter tool 110 may save the content-length header in a parameterized manner (e.g., including a variable indicating content-length). Variables stored in messages included in the processed message transaction may ultimately be expressed as test scenario variables, for example, as described herein.

Some messages include a content-type header that specifies a particular content type of the message body. An example of such a content type is Multipurpose Internet Mail Extension (MIME). The presence of a content-type header often indicates that additional analysis and/or transformations will be required during scenario and/or test generation. For example, the presence of a content-header may indicate that special characters should be analyzed; additional parsing should be performed, etc. Also, binary content types may be subject for truncation, as described below.

A content-transfer-encoding header, if present, specifies an additional content transformation that may be performed on a message body (e.g., HTTP message body) in transit. Such transformation is typically performed to make the content compatible with older protocols. A content-encoding header may specify additional content transformation performed on the message body in transit. For example, a content-encoding header may indicate that the message is to be transformed in transit to reduce message size "on the wire" (e.g., in transit). The presence and content of the content-encoding header may indicate the transformation to be performed. A transfer-encoding header may specify whether and, if so, what kind of transformation was applied to the message body prior to transmission in order to safely transfer it between the sender and recipient. The contents of a "transfer-encoding" header may be used during testing to accurately represent that transformation during testing.

A date header indicates the date and time at which the message was sent. During testing, this date and time will often need to be set based on when the generated test messages are sent. Accordingly, upon storing the date header, the converter tool 110 may parameterize the date header (e.g., include one or more variables that may be provided with values during test execution). Similarly, an expiration header may specify a date and time after which the message is considered stale and, therefore, should be recalculated. During testing, this field will also need to be set based on when test messages are sent. Accordingly, the converter tool 110 may also parameterize the expiration header.

A set-cookie header may be used by an origin web server to save user specific information on the browser 104 and retrieve it back on subsequent requests. The user-specific information may be considered state information and is used to identify the user and a session. During testing, the user specific information may be randomized to accurately represent different users. Accordingly, set-cookie headers may also be parameterized by the converter tool 110.

In addition to the header saving/processing described herein above, message normalization at 510 may also include normalizing and/or other processing of the message body or data. Example aspects of the message body that may be normalized include message size, message structure and certain special symbol characters in text based content types.

Regarding size, for many messages, it is possible and desirable to reduce the message size (and thereby the size of the resulting test scenario) by truncating the message body. For example, when the content of the message is binary-encoded audio/video data, truncating the message body may significantly reduce the size of the ultimate test scenario without sacrificing application semantics and the validity of the scenario. To reduce message size, the content-length header of the message may be examined to determine the size of the original content. In some example embodiments, content greater than a threshold length may be further considered for truncation. When message content is considered for truncation, the content-type and other relevant headers may be examined to determine whether the content is text-based or binary. In various example embodiments, text based content may not be truncated as it may be relevant to application semantics to be maintained during testing. Non-text based content (e.g., binary content) may be truncated by the converter tool 110.

Regarding structure, the messages can be used to pass structured information such as form used, for example, to provide authentication credentials, user preferences, etc. During processing, this structured content may be parsed to find user sensitive information such as, for example, user names and passwords. These portions of the messages may be parameterized with unique random variables, while the original sensitive information is purged. Regarding special symbols, such content may be included in the text-based content of certain messages. Special symbols may include special characters and language constructs (e.g., in JavaScript, XML, etc.) that require special handling, often referred to as escaping. During processing, text based content may be examined for such characters, which may be re-written according to rules provided to the converter tool 110.

Figure 7:
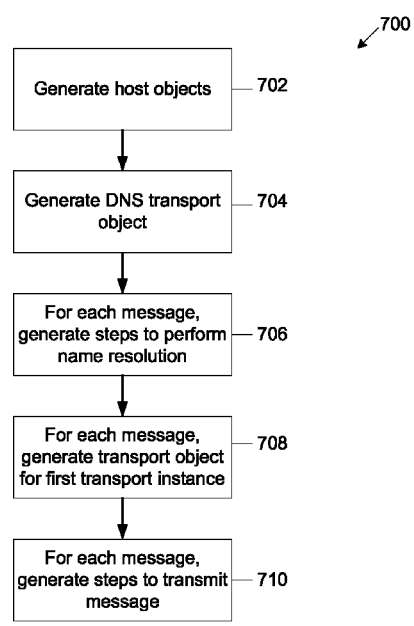
FIG. 7 is a flowchart illustrating one example embodiment of a process flow for generating a test scenario from a processed transaction.

FIG. 7 is a flowchart illustrating one example embodiment of a process flow 700 for generating a test scenario from a processed message transaction 218. The process flow 700 may be executed, for example, by the converter tool 110. The result of the application of the process flow 700 to a processed transaction 218 may be a scenario 212, which may be stored at storage 202. The scenario 212 may be expressed using any suitable protocol or language including, for example, such as XML or a scripting language, such as a human-readable scripting language. In some example embodiments, the scenario 212 is expressed by an XML schema adhering to the XML Schema Definition (XSD) format. For example, the scenario 212 may be expressed in the Mu Scenario Template language (filename extension .mus) or in a scripting language such as the Mu Scenario Language or "MuSL" (filename extension .msl). If a scenario is expressed using plain-text (e.g., using the Mu Scenario Template language or MuSL), then a person can edit and/or create a scenario by typing into a text editor.

It will be appreciated that using a platform-independent language, such as the examples provided above, may provide several advantages. With a standardized language, scenarios may be portable from the device used to create the scenario to a device that may later be used to play the scenario as a test. Also, the scenarios themselves, expressed in a standardized format, may be independent of the playback engine that is used to play them for testing. Thus, scenarios can be used as the input for generating and playing large numbers of instances for scale testing. Scenarios may also be independent of a particular display device or display interface. Accordingly, scenarios may serve as the input for several types of display formats depicting different aspects of the scenario that may be of interest to a user. Examples of scenarios and related data in the formats described above are provided in commonly-assigned U.S. patent application Ser. No. 13/101, 728 (the '728 application) titled, "Generating Communication Protocol Test Cases Based On Network Traffic," filed on May 5, 2011 and U.S. patent application Ser. No. 13/118,155, (the '155 application) titled, "Scenario Based Scale Testing," filed on May 27, 2011, both of which are incorporated by reference herein in their entireties.

Referring again to FIG. 7, at 702, the converter tool 110 may generate scenario objects for each host in the message transaction (e.g., as identified at 502 above). The hosts may include the application host 106 and the various server hosts 114. In some embodiments, the converter tool 110 is configured to generate the scenario in a DNS emulation mode. According to the DNS emulation mode, tests generated from the scenario may (optionally) include messages request/response pairs involving the DNS host 116, for example, to model such transactions. When the scenario 212 is generated in DNS emulation mode, an object may also be generated for DNS host 116. Also, when the scenario 212 is generated in DNS emulation mode, the converter tool 110 may create a DNS transport object at 704.

Under certain circumstances, the converter tool 110 may generate instructions to perform name resolution at 706. For example, when the converter tool 110 is operated in DNS emulation mode, and when a particular server host 114 is encountered for the first time in a message, that message may be represented in the scenario 212 in conjunction with an instruction for querying a host name from the DNS host 116. Also the converter tool 110 may generate transport objects for other instances at 708. When a transport is first encountered in a message, a corresponding transport object may be determined. Also, in some embodiments, transport objects are generated based on transports identified as described at 502 above. For each message, the converter tool 110 may also generate instructions for exchanging the message between the source and destination host. The instructions and objects determined according to the process flow 700 may be incorporated into the scenario 212. In some example embodiments, the scenario 212 may include additional objects and/or instructions or may omit some of the objects and/or instructions described herein.

Upon generation, the scenario 212 may be utilized for various scale and/or mutation testing to be performed on a device under test (DUT). For example, the scenario 212 may be used as the basis for scale testing. For scale testing, a scenario may be processed and coupled with a pattern and/or a dataset to form a track. The scale test engine 214, described herein, may execute the track by executing multiple instances of the processed scenario. One way to automatically generate tracks based on a scenario is to use the Mu Studio software application from Mu Dynamics of Sunnyvale, Calif. The Mu Studio application can also be used to view and/or edit the information within a scenario in a graphical user interface (GUI) format. This GUI format may include a list of all transaction content (packet list or flow list) and a call graph (highlights message exchange between individual hosts). Scenario editing or customization can include changing values of fields, adding options and/or variables, adding padding, creating relationships between fields (e.g., checksums), and constructing assertions designed to verify expected activity. The Mu Studio application can also be used to verify a scenario against a target device or application.

Figure 8:
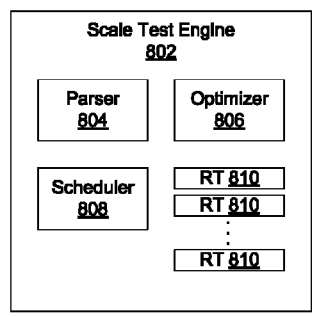
FIG. 8 is a block diagram of a scale test engine for processing one or more scenarios, generating and executing tracks for scale testing.

FIG. 8 is a block diagram of a scale test engine 214 for processing one or more scenarios, generating tracks for scale testing and executing the tracks. The scale test engine 214 may be executed by a computer system. For example, in various example embodiments, the scale test engine 214 may be executed by the system 200 illustrated in FIG. 2. In other example embodiments, the scale test engine 214 is executed by a system that does not also generate scenarios. The scale test engine 214 may comprise a parser module 804, an optimizer module 806, a scheduler 808 and, in some example embodiments, one o more runtimes 810. The parser 804 may receive the scenario 212 (e.g., expressed in a scripting language such as the MuSL, a mark-up language such as XML, etc.) and may perform various tallying and indexing of the objects making up the scenario. This may simplify later optimization and/or serialization of the scenario (e.g., by requiring fewer processor cycles). The parsing may also comprise, for example, converting the scenario to an abstract syntax tree. The optimizer 806 may receive the scenario 212 after it is processed by the parser 804 and perform additional processing/optimization to facilitate scale testing. In some example embodiments, the functionality of the parser 804 and optimizer 806 may be combined into a single component. The result of the parser 604 and optimizer 806 may be a processed scenario 218 that may, in some example embodiments, be partially or completely immutable. It will be appreciated that the parsing/processing of the scenario 212 is omitted in some example embodiments.

The scheduler 808 and the one or more runtimes 810 may execute and manage scale testing based on the processed scenario 212. For example, the processed scenario 218 may be included in tracks comprising the processed scenario 218, a pattern, such as pattern 222, and a dataset, such as dataset 220. In various example embodiments, the tracks may be executed asynchronously. One or more runtimes 810 may execute the track by executing a number of instances of the processed scenario consistent with the pattern and, in example embodiments, utilizing variable and/or option values as set forth in the dataset. In various example embodiments, the one or more processed scenario files, datasets, and patterns may be stored in a storage of the system implementing the scale test engine 214. For example, as indicated by 218, 220 and 222 shown at the storage 202 of the system 200. Also, although the functionality of the parser 804, optimizer 806, scheduler 808 and runtimes 810 are illustrated herein as part of a common scale test engine 214, it will be appreciated that these components may be implemented separately. Also, in various example embodiments, the functionality of some or all of the components may be merged. For example, the parser 804 and optimizer 806 may be merged into a common module. Additional details of scale testing, as generated from scenarios and processed scenarios are provided in the '278 and '155 applications, incorporated by reference herein above.

Scenarios expressed in a standard language, such as the scenario 212, may also be used as the input for other types of tests such as functional tests and mutation tests by sending them to playback engines optimized for these types of testing, such as those also available from Mu Dynamics of Sunnyvale, Calif. For example, a scenario may be used for automated test (e.g., mutation test) creation. Example embodiments utilizing scenarios to create and execute test cases are provided in the '728 application, incorporated by reference herein above. Examples for generating test cases using protocol mutation are described in commonly owned U.S. patent application Ser. No. 11/351,309, titled "Portable Program for Generating Attacks on Communication Protocols," filed Feb. 10, 2006, and U.S. patent application Ser. No. 11/351,403, titled "Platform for analyzing the security of communication protocols and channels", also filed Feb. 10, 2006, the disclosures of which are incorporated herein by reference in their entireties.

Various example embodiments are directed to systems and methods for testing the performance of a pass-through computer device (device under test or DUT) taking part in a message exchange. The systems and methods may be configured to operate regardless of any changes made by the DUT to addressing information of the various messages. For example, the DUT may be a proxy and/or may perform Network Address Translation (NAT). Tests of the DUT may be performed by a test engine according to a scenario. As described herein, the scenario may set forth a model message exchange involving the DUT and at least one host including a message definition for at least one message. The message exchange may be between a first host (e.g., a client) and a second host (e.g., a server). Some message exchanges may be between more than two hosts. For example, a client web application may request a web page that is served by multiple hosts. Also, for example, peer-to-peer protocol transactions may involve multiple hosts. As described herein, the scenario may also comprise objects including, for example, at least one host, at least one transport object utilized for the message exchange, at least one variable or option describing a potential variation in the message exchange, one or more instructions for the message exchange, etc. The DUT may be logically positioned between hosts for at least one of the messages of the message exchange. For example, the DUT may receive a transmitted message from a first host and, in response, forward a message (e.g., a forwarded message) to the second host. In some example embodiments, the DUT may perform additional processing on the transmitted message to generate the forwarded message.

During testing, a test engine may execute one or more instances or instances of the scenario. For example, an instance of the scenario may be executed by itself or concurrently with other instances. In various example embodiments, the test engine may implement and/or emulate all of the non-DUT hosts that are parties to the message exchange. Accordingly, executing an instance or concurrency of a scenario may involve the test engine transmitting outgoing messages to the DUT according to a model message definition set forth in the scenario and monitoring forwarded messages received from the DUT in return. Each outgoing message may have specific values that are instance and/or message exchange-specific (e.g., Internet Protocol (IP) address and port numbers for the source and destination). Upon receiving the outgoing message, the DUT may forward it to its indicated destination.

To perform various kinds of tests on the DUT (e.g., scale testing as described above, mutation testing, etc.), it may be desirable for the test engine to match corresponding outgoing and forwarded messages. For many pass-through DUT's, outgoing messages and corresponding forwarded messages may be matched based on addressing information. For example, both the outgoing message and the forwarded message will indicate the same source and destination addressing information. When the DUT is a proxy or performs NAT, however, it modifies addressing information between the transmitted and forwarded messages, making it difficult to match outgoing and forwarded messages by addressing information. Accordingly, in various example embodiments, the scenario may specify that a message exchange identifier be placed in the transmitted messages. The message exchange identifier may uniquely indicate the message exchange containing the outgoing and forwarded messages.

The message exchange identifier may be embedded in the transmitted messages in any suitable manner. For example, the scenario (e.g., a message definition) may specify an identifier location within the message or messages of the message exchange. The identifier location may be positioned such that the message exchange identifier may be extracted from the message using a filter. For example, the test engine may apply the filter to forwarded messages to extract their message exchange identifiers. The filter may be any suitable type of filter. For example, an offset and length filter may be used and applied to the messages in binary form. Also, in some example embodiments, a regular expression filter may be used and applied to messages in textual form. Upon extracting an message exchange identifier from a forwarded message, the test engine may be able to correlate the forwarded message with its corresponding transmitted message. This correlation may be used by the test engine in various kinds of testing including, for example, scale testing and mutation testing.

A "communication protocol" refers to an exchange of data or messages in a known, structured format. Specifically, a protocol refers to what is being communicated (for example, the data or message content). Types of protocols include, for example, networking protocols (including network packets) and application-layer protocols (application program interfaces or "APIs", including API calls, remote method invocation (RMI), and remote procedure call (RPC)).

The implementation of a communication protocol may be tested using test cases. A test case generally includes one or more message exchanges between two or more entities (e.g., two devices or two processes). A test case (e.g., the messages that are exchanged) can be generated manually or automatically, as described in commonly-assigned U.S. patent application Ser. No. 11/514,809, filed Sep. 1, 2006, titled "Automated Generation of Attacks for Analyzing the Security of Communication Protocols and Channels" (the '809 Application), which is incorporated by reference herein in its entirety.

A protocol is generally defined by a specification. The specification can be expressed in a variety of formats, such as an Internet Engineering Task Force (IETF) Request for Comments (RFC), Web Services Description Language (WSDL), Backus-Naur Form (BNF), Augmented BNF (ABNF), regular expressions, Interface Definition Language (IDL), Document Type Definition (DTD), Management Information Base (MIB), eXtended Markup Language (XML) schema, eXternal Data Representation (XDR), and Abstract Syntax Notation 1 (ASN.1). The '809 Application describes software programs that parse machine-readable protocol specifications and generate test cases based on the specifications.

Any patent, publication, or other disclosure material, in whole or in part, that is said to be incorporated by reference herein is incorporated herein only to the extent that the incorporated materials does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

Reference in the specification to "one embodiment," "an embodiment" "an example embodiment," "some example embodiments," "various example embodiments," etc. means that a particular feature, structure, or characteristic described in connection with the embodiments is included in at least one embodiment of the invention. Reference to embodiments is intended to disclose examples, rather than limit the claimed invention.

Some portions of the above are presented in terms of methods and symbolic representations of operations on data bits within a computer memory. These descriptions and representations are the means used by those skilled in the art to most effectively convey the substance of their work to others skilled in the art. A method is here, and generally, conceived to be a self-consistent sequence of actions (instructions) leading to a desired result. The actions are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of actions requiring physical manipulations of physical quantities as modules or code devices, without loss of generality.

It should be borne in mind, however, that all of these and similar terms are to be associated with the appropriate physical quantities and are merely convenient labels applied to these quantities. Unless specifically stated otherwise as apparent from the preceding discussion, it is appreciated that throughout the description, discussions utilizing terms such as "processing" or "computing" or "calculating" or "determining" or "displaying" or "determining" or the like, refer to the action and processes of a computer system, or similar electronic computing device, that manipulates and transforms data represented as physical (electronic) quantities within the computer system memories or registers or other such information storage, transmission or display devices.

Certain aspects of the present invention include process instructions described herein in the form of a method. It should be noted that the process instructions of the present invention can be embodied in software, firmware or hardware, and when embodied in software, can be downloaded to reside on and be operated from different platforms used by a variety of operating systems.

The present invention also relates to an apparatus for performing the operations herein. This apparatus may be specially constructed for the required purposes, or it may comprise a general-purpose computer selectively activated or reconfigured by a computer program stored in the computer. Such a computer program may be stored in a tangible computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of tangible media suitable for storing electronic instructions, and each coupled to a computer system bus. Furthermore, the computers and computer systems referred to in the specification may include a single processor or may be architectures employing multiple processor designs for increased computing capability.

The methods and displays presented herein are not inherently related to any particular computer or other apparatus. Various general-purpose systems may also be used with programs in accordance with the teachings herein, or it may prove convenient to construct more specialized apparatus to perform the required method actions. The required structure for a variety of these systems will appear from the above description. In addition, the present invention is not described with reference to any particular programming language. It will be appreciated that a variety of programming languages may be used to implement the teachings of the present invention as described herein, and any references above to specific languages are provided for disclosure of enablement and best mode of the present invention.

While the invention has been particularly shown and described with reference to various example embodiments, it will be understood by persons skilled in the relevant art that various changes in form and details can be made therein without departing from the spirit and scope of the invention.

Finally, it should be noted that the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention.

We claim:

1. A computer-implemented system, the system comprising at least one processor and operatively associated memory, wherein the at least one processor is programmed to:
  execute an application host;
  execute a browser, wherein messages originating from the application host and messages directed to the application host are routed through the browser, and wherein the browser is programmed to capture a plurality of application-layer messages, the plurality of application-layer messages comprising a plurality of requests originating from the application host and a plurality of responses directed to the application host; and
  generate a test scenario based on the plurality of application-layer messages.

2. The system of claim 1, wherein the at least one processor is further programmed to execute a plug-in to the browser, wherein the plug-in to the browser is programmed to capture the plurality of application-level messages.

3. The system of claim 1, wherein the application-layer messages are HTTP messages.

4. The system of claim 1, wherein the at least one processor is further programmed to:
identify unique transports utilized by the plurality of messages, wherein each unique transport is described by a destination host and a destination port;
identify a plurality of hosts identified by the plurality of messages;
classify the plurality of messages into a plurality of message pairs, wherein each message pair comprises at least one request message and at least one reply message corresponding to the at least one request message;
filter at least a portion of the message pairs; and
normalize content of at least a portion of the plurality of messages.

5. The system of claim 4, wherein at least a portion of the unique transports are encrypted.

6. The system of claim 4, wherein identifying the plurality of hosts comprises, for at least one of the plurality of hosts, querying a domain name service (DNS) host to identify a name of the at least one host.

7. The system of claim 4, wherein the filtering comprises:
comparing destination hosts for at least a portion of the message pairs to a list of filterable hosts;
conditioned upon a message pair involving a destination host included on the list of filterable hosts, removing the message pair from the plurality of messages.

8. The system of claim 4, wherein the filtering comprises:
identifying messages from the plurality of messages that have at least one predetermined content type;
removing the identified messages from the plurality of messages.

9. The system of claim 4, wherein normalizing content of at least a portion of the plurality of messages comprises expressing at least a portion of a header of at least one of the plurality of messages as a variable in the test scenario.

10. The system of claim 4, wherein normalizing content of at least a portion of the plurality of messages comprises truncating at least a portion of a body of a first message selected from the plurality of messages.

11. The system of claim 10, wherein truncating at least the portion of the body of the first message comprises
identifying a first portion of the body that is binary and a second portion of the body that is text-based; and
truncating the first portion of the body.

12. The system of claim 4, wherein generating the test scenario comprises:
generating scenario objects for each of the plurality of hosts identified by the plurality of messages;
generating scenario objects for each unique transport utilized by the plurality of messages;
for each of at least a portion of the plurality of messages generate at least one instruction for exchanging the message between a source host and a destination host.

13. The system of claim 12, wherein the test scenario is generated according to a DNS emulation mode, and wherein generating the test scenario further comprises:
generating a scenario object for a domain name service (DNS) host;
generating a scenario object for a transport between the application host and a domain name service (DNS) host;
for each of at least a portion of the plurality of messages, generate instructions to perform name resolution utilizing the DNS host and the transport between the application host and the DNS host.

14. The system of claim 1, wherein the at least one processor is further programmed to:
identify at least one cookie value identifying state information related to at least one of a user of the application host and a session of the application host; and
express the at least one cookie value as a variable of the test scenario.

15. A computer-implemented method for testing, the method comprising:
receiving, by the computer system, a plurality of application-layer messages,
wherein the computer system comprises at least one processor and associated memory,
wherein messages from the plurality of application-layer messages that originate from the application host and messages from the plurality of application-layer messages that are directed to the application host are routed a browser,
wherein the plurality of application-layer messages comprises a plurality of requests originating from an application host,
wherein the plurality of application-layer messages also comprises a plurality of responses directed to the application host, and
wherein the plurality of application-layer messages are captured by the browser; and
generating, by the computer system, a test scenario based on the plurality of application-layer messages.

16. The method of claim 15, further comprising:
executing, by the computer system, the application host; and
executing, by the computer system, the browser.

17. The method of claim 15, wherein the browser comprises a plug-in to the browser, wherein the plug-in to the browser is programmed to capture the plurality of application-layer messages.

18. The method of claim 15, wherein the application-layer messages are HTTP messages.

19. The method of claim 15, further comprising:
identifying, by the computer system, unique transports utilized by the plurality of messages, wherein each unique transport is described by a destination host and a destination port;
identifying, by the computer system, a plurality of hosts identified by the plurality of messages;
classifying, by the computer system, the plurality of messages into a plurality of message pairs, wherein each message pair comprises at least one request message and at least one reply message corresponding to the at least one request message;
filtering, by the computer system, at least a portion of the message pairs; and
normalizing, by the computer system, content of at least a portion of the plurality of messages.

20. The method of claim 19, wherein at least a portion of the unique transports are encrypted.

21. The method of claim 19, wherein identifying the plurality of hosts comprises, for at least one of the plurality of hosts, querying a domain name service (DNS) host to identify a name of the at least one host.

22. The method of claim 19, wherein the filtering comprises:
comparing destination hosts for at least a portion of the message pairs to a list of filterable hosts;

conditioned upon a message pair involving a destination host included on the list of filterable hosts, removing the message pair from the plurality of messages.

23. The method of claim 19, wherein the filtering comprises:
   identifying messages from the plurality of messages that have at least one predetermined content type; and
   removing the identified messages from the plurality of messages.

24. The method of claim 19, wherein normalizing content of at least a portion of the plurality of messages comprises expressing at least a portion of a header of at least one of the plurality of messages as a variable in the test scenario.

25. The method of claim 19, wherein normalizing content of at least a portion of the plurality of messages comprises truncating at least a portion of a body of a first message selected from the plurality of messages.

26. The method of claim 25, wherein truncating at least the portion of the body of the first message comprises
   identifying a first portion of the body that is binary and a second portion of the body that is text-based; and
   truncating the first portion of the body.

27. The method of claim 19, wherein generating the test scenario comprises:
   generating scenario objects for each of the plurality of hosts identified by the plurality of messages;
   generating scenario objects for each unique transport utilized by the plurality of messages;
   for each of at least a portion of the plurality of messages generate at least one instruction for exchanging the message between a source host and a destination host.

28. The method of claim 27, wherein the test scenario is generated according to a DNS emulation mode, and wherein generating the test scenario further comprises:
   generating a scenario object for a domain name service (DNS) host;
   generating a scenario object for a transport between the application host and a domain name service (DNS) host;
   for each of at least a portion of the plurality of messages, generate instructions to perform name resolution utilizing the DNS host and the transport between the application host and the DNS host.

29. The method of claim 1, further comprising:
   identifying at least one cookie value identifying state information related to at least one of a user of the application host and a session of the application host; and
   expressing the at least one cookie value as a variable of the test scenario.

* * * * *